(12) United States Patent
Hwang et al.

(10) Patent No.: US 8,619,015 B2
(45) Date of Patent: Dec. 31, 2013

(54) LIQUID CRYSTAL DISPLAY AND METHOD OF DRIVING THE SAME

(75) Inventors: In-jae Hwang, Cheonan-si (KR); Sang-moon Mo, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 1422 days.

(21) Appl. No.: 11/843,255

(22) Filed: Aug. 22, 2007

(65) Prior Publication Data

US 2008/0117157 A1 May 22, 2008

(30) Foreign Application Priority Data

Nov. 20, 2006 (KR) .................. 10-2006-0114696

(51) Int. Cl.
 *G09G 3/36* (2006.01)
(52) U.S. Cl.
 USPC .............................. 345/99; 345/87; 345/100
(58) Field of Classification Search
 USPC ................................................. 345/30–111
 See application file for complete search history.

(56) References Cited

U.S. PATENT DOCUMENTS

| | | | |
|---|---|---|---|
| 6,052,426 A * | 4/2000 | Maurice | 377/78 |
| 6,236,385 B1 * | 5/2001 | Nomura et al. | 345/95 |
| 7,522,160 B2 * | 4/2009 | Moon | 345/204 |
| 2002/0118157 A1 * | 8/2002 | Lee et al. | 345/87 |
| 2003/0038766 A1 * | 2/2003 | Lee et al. | 345/87 |
| 2004/0041774 A1 | 3/2004 | Moon | |
| 2005/0035958 A1 | 2/2005 | Moon | |
| 2006/0017686 A1 * | 1/2006 | Park | 345/100 |

FOREIGN PATENT DOCUMENTS

| | | |
|---|---|---|
| KR | 1020040020421 A | 3/2004 |
| KR | 100624116 B1 | 9/2006 |

OTHER PUBLICATIONS

European Search Report for European Application No. 07 02 0752.7 dated Apr. 29, 2009.

* cited by examiner

*Primary Examiner* — Charles V Hicks
(74) *Attorney, Agent, or Firm* — Cantor Colburn LLP (57) ABSTRACT

A liquid crystal display with improved display quality and a method of driving the same include a timing controller which receives a main clock signal and outputs a first clock generation control signal and a second clock generation control signal which has a variable duty ratio, a clock generator which receives the first clock generation control signal and the second clock generation control signal and outputs a first clock signal and a second clock signal which have variable duty ratios and opposite phases, a gate driver which receives the first clock signal and the second clock signal and outputs gate signals which have variable duty ratios, and a liquid crystal panel including a plurality of pixels which are turned on according to the gate signals and display an image.

24 Claims, 9 Drawing Sheets

FIG. 10

LIQUID CRYSTAL DISPLAY AND METHOD OF DRIVING THE SAME

This application claims priority to Korean Patent Application No. 10-2006-0114696, filed on Nov. 20, 2006, and all the benefits accruing therefrom under 35 U.S.C. §119, the contents of which in its entirety are herein incorporated by reference.

BACKGROUND OF THE INVENTION

1. Field of the Invention

The present invention relates to a liquid crystal display and a method of driving the same, and more particularly, to a liquid crystal display having improved display quality and a method of the driving the same.

2. Description of the Related Art

In many liquid crystal displays, gate driving integrated circuits ("ICs") are mounted in the form of a tape carrier package ("TCP"), a chip on glass ("COG") or other suitable mounting method, but another method has been explored in search of improved manufacturing costs or product size and design. More specifically, gate driving ICs are not used; instead, gate drivers which generate gate signals using amorphous silicon thin film transistors ("a-Si TFTs") are mounted on glass substrates.

Each of the gate drivers includes a plurality of a-Si TFTs. Each of the plurality of a-Si TFTs, which output gate signals, operates when receiving a first clock signal and a second clock signal. A frequency and a duty ratio of each of the first clock signal and the second clock signal change according to a frame frequency of the liquid crystal display. For example, when the frame frequency is at a low frequency relative to other frame frequencies of the liquid crystal display, elapsed time when the first and the second clock signals are at a high level (e.g., when the digital clock pulse is "on") increases as compared to when the frame frequency is higher. Put another way, when the frame frequency is at the low frequency, the duty ratios of the first and the second clock signals increase compared to when the frame frequency is at a higher frequency. In addition, the a-Si TFTs have a high charge mobility characteristic which increases with temperature. As a result, an a-Si TFT which receives the first and second clock signals where the elapsed time when first and second clock signals is at a high level during one period is long may erroneously output a gate on voltage several times during one frame, resulting in deterioration of the display quality of the liquid crystal display.

Therefore, to prevent erroneous operation of the gate driver which causes display quality to deteriorate, the elapsed time when the first clock signal and the second clock signal are at a high level should be constant regardless of the frame frequency.

BRIEF SUMMARY OF THE INVENTION

An exemplary embodiment of the present invention provides a liquid crystal display which has an advantage of effectively reduced or prevented erroneous operation of a gate driver, resulting in improved display quality. Alternative exemplary embodiments of the present invention are not limited to those mentioned herein, and other exemplary embodiments of the present invention will be apparent to those skilled in the art through the following description.

According to one exemplary embodiment of the present invention, a liquid crystal display includes a timing controller which receives a main clock signal and which outputs a first clock generation control signal and a second clock generation control signal, a duty ratio of which is variable, a clock generator which receives the first clock generation control signal and the second clock generation control signal and outputs a first clock signal and a second clock signal which have variable duty ratios and opposite phases, a gate driver which receives the first clock signal and the second clock signal and outputs gate signals which have variable duty ratios, and a liquid crystal panel including a plurality of pixels which turn on in response to the gate signals and display an image.

The timing controller outputs the second clock generation control signal. The duty ratio of the second clock generation control signal decreases when a frequency of the main clock signal is less than a reference frequency and increases when the frequency of the main clock signal is greater than the reference frequency.

The timing controller includes a comparing unit which compares the frequency of the main clock signal with the reference frequency and supplies a counting control signal which controls a counting number according to a result of the comparison and a counting unit which outputs the second clock generation control signal at a high level while counting rising edges or falling edges of the main clock signal on the basis of the counting number which corresponds to the counting control signal.

The comparing unit compares the frequency of the main clock signal with the reference frequency by counting the rising edges or the falling edges of the main clock signal per unit of time, supplies the counting control signal which corresponds to a counting number less than a reference counting number when the frequency of the main clock signal is less than the reference frequency, and supplies the counting control signal which corresponds to a counting number greater than the reference counting number when the frequency of the main clock signal is greater than the reference frequency.

The reference counting number is a previously set counting number of the rising edges or the falling edges of the main clock signal.

The timing controller outputs the second clock generation control signal. The second clock generation control signal has a duty ratio which decreases when a frequency of the first clock generation control signal is less than a reference frequency and increases when the frequency of the first clock generation control signal is greater than the reference frequency.

The timing controller may further include a comparing unit which compares the frequency of the second clock generation control signal with the reference frequency and supplies the counting control signal which controls the counting number according to the result of the comparison and a counting unit which outputs the second clock generation control signal at the high level while counting rising edges or falling edges of the main clock signal on the basis of the counting number which corresponds to the counting control signal.

The comparing unit may compare the frequency of the second clock generation control signal with the reference frequency by counting the rising edges or the falling edges of the second clock generation control signal per unit of time, supplies the counting control signal which corresponds to the counting number less than a reference counting number when the frequency of the second clock generation control signal is less than the reference frequency, and supplies the counting control signal which corresponds to the counting number greater than the reference counting number when the frequency of the second clock generation control signal is greater than the reference frequency.

The reference counting number may be previously set by counting a number of the rising edges or the falling edges of the second clock generation control signal.

The first and second clock signals include first through third periods during which the first and second clock signals have different levels from each other.

More specifically, the first clock signal is at a first level during the first period, is at a second level different from the first level during the second period, and transits from the first level to the second level or from the second level to the first level during the third period. Likewise, the second clock signal is at the second level during the first period, is at the first level during the second period, and transits from the first level to the second level or from the second level to the first level during the third period.

The first and the second periods decrease and the third period increases when the frequency of the main clock signal is less than the reference frequency and the first and the second periods increase and the third period decreases when the frequency of the main clock signal is greater than the reference frequency.

The third period is a charge sharing period during which a level of the second clock signal rises when a level of the first clock signal falls, and during which the level of the second clock signal falls when the level of the first clock signal rises.

The liquid crystal display includes a third clock generation control signal obtained by performing an OR operation on the first clock generation control signal and the second clock generation control signal.

The first and second clock signals are at the high level or a low level during a period in which the third clock generation control signal is at a high level and the first and second clock signals transition from the high level to the low level or from the low level to the high level during a period which the third clock generation control signal is at the low level.

The clock generator includes an OR operator which receives the first clock generation control signal and the second clock generation control signal and outputs the third clock generation control signal to a D flip-flop and a charge sharing unit, a first clock voltage applying unit which receives the first clock enable signal and outputs the first level of the first clock signal during the first period and the second level of the first clock signal during the second period and a second clock voltage applying unit which receives the second clock enable signal and outputs the second level of the second clock signal during the first period and the first level of the second clock signal during the second period.

The D flip-flop outputs a first clock enable signal having a phase which is inverted at each rising edge of the third clock generation control signal and a second clock enable signal having a phase which is opposite to the phase of the first clock enable signal.

The charge sharing unit receives the third clock generation control signal and controls transition of the first and second clock signals during the third period.

The gate driver includes a plurality of stages which sequentially output the gate signals, and each stage of the plurality of stages includes at least one amolphous-silicon thin film transistor ("a-Si TFT").

In an exemplary embodiment of the present invention, the time when the second clock generation control signal is at the high level during one period is constant regardless of a frame frequency of the liquid crystal display.

Another exemplary embodiment of the present invention provides a method of driving a liquid crystal display, the method including receiving a main clock signal, outputting a first clock generation control signal and a second clock generation control signal, a duty ratio of which varies, receiving the first clock generation control signal and the second clock generation control signal and outputting a first clock signal and a second clock signal which have variable duty ratios and opposite phases, receiving the first clock signal and the second clock signal and outputting gate signals which have variable duty ratios, and turning on pixels in response to the gate signals to display an image.

The duty ratio of the second clock generation control signal decreases when a frequency of the main clock signal is less than a reference frequency and increases when the frequency of the main clock signal is greater than the reference frequency.

The outputting of the second clock generation control signal includes comparing the frequency of the main clock signal with the reference frequency, supplying a counting control signal which controls a counting number according to a result of the comparison, and outputting the second clock generation control signal which is at a high level while counting rising edges or falling edges of the main clock signal on the basis of the counting number which corresponds to the counting control signal.

The duty ratio of the second clock generation control signal decreases when a frequency of the second clock generation control signal is less than a reference frequency and increases when the frequency of the second clock generation control signal is greater than the reference frequency.

The outputting of the second clock generation control signal may further include comparing the frequency of the second clock generation control signal with the reference frequency, supplying a counting control signal which controls a counting number according to a result of the comparison, and outputting the second clock generation control signal which is at the high level while counting rising edges or falling edges of the main clock signal on the basis of the counting number which corresponds to the counting control signal.

The time when the second clock generation control signal is at the high level during one period is constant regardless of a frame frequency of the liquid crystal display.

BRIEF DESCRIPTION OF THE DRAWINGS

The above and other aspects, features and advantages of the present invention will become more apparent by describing in further detail exemplary embodiments thereof with reference to the attached drawings, in which.

DETAILED DESCRIPTION OF THE INVENTION

The invention now will be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, a duty ratio is defined as duration of time for which a signal is maintained at a high level in one period of a particular clock signal.

Figure 1:
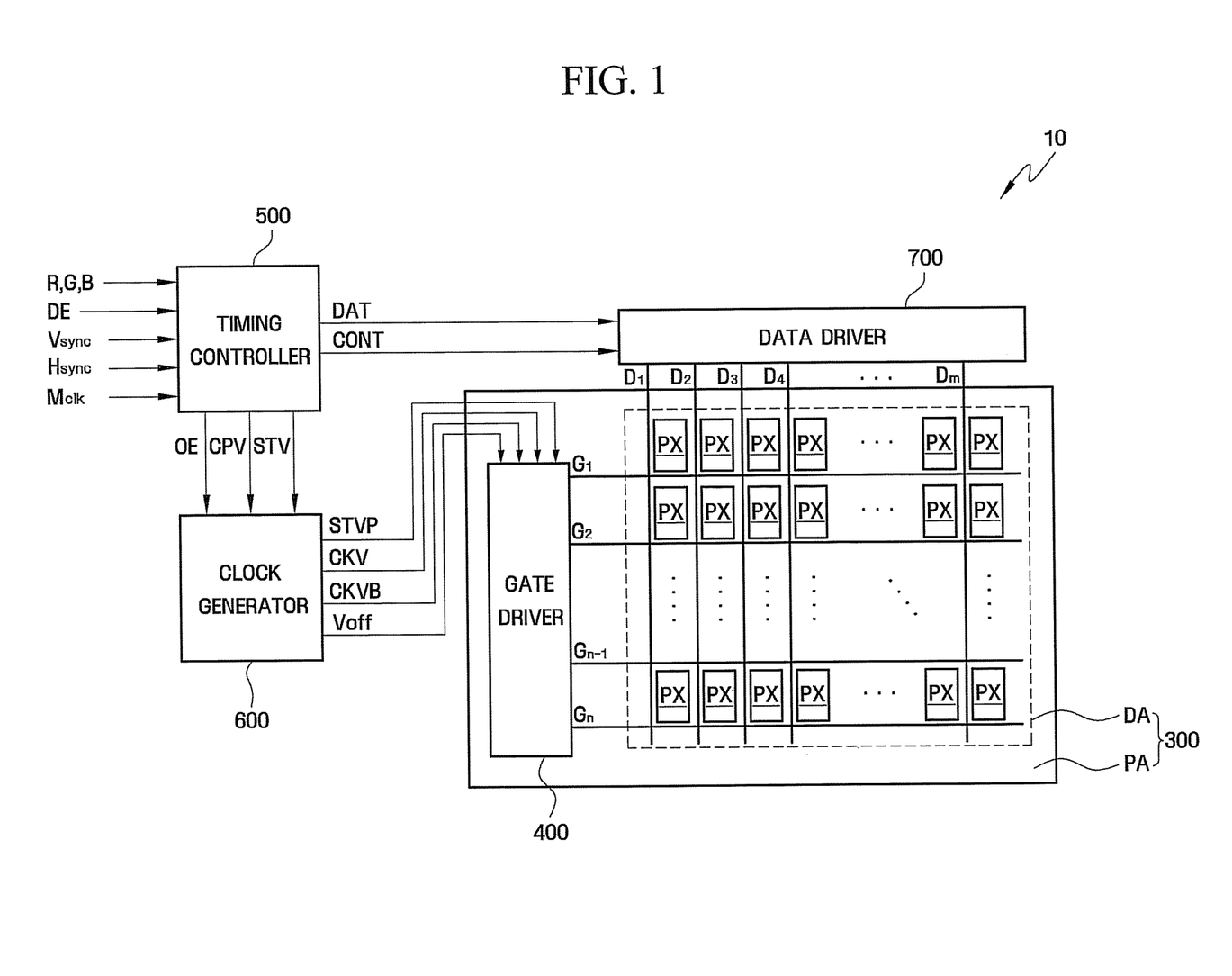
FIG. 1 is a block diagram of a liquid crystal display according to an exemplary embodiment of the present invention.
Figure 2:
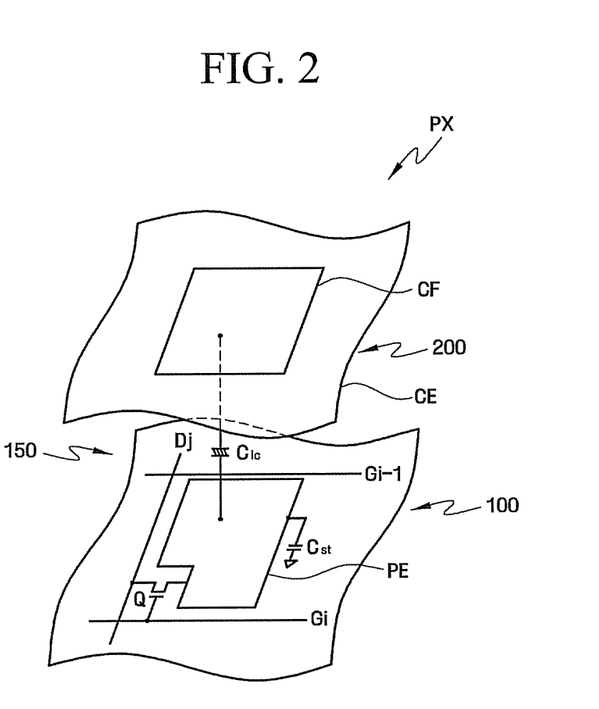
FIG. 2 is an equivalent circuit diagram of one pixel of the liquid crystal display of FIG. 1 according to an exemplary embodiment of the present invention.

A liquid crystal display according to one exemplary embodiment of the present invention will be described hereinafter in further detail with reference to FIGS. 1 and 2. FIG. 1 is a block diagram of a liquid crystal display according to an exemplary embodiment of the present invention. FIG. 2 is an equivalent circuit diagram of one pixel of the liquid crystal display of FIG. 1 according to an exemplary embodiment of the present invention.

Referring to FIGS. 1 and 2, a liquid crystal display 10 according to an exemplary embodiment of the present invention includes a liquid crystal panel 300, a timing controller 500, a clock generator 600, a gate driver 400 and a data driver 700.

The liquid crystal panel 300 is divided into a display area DA where an image is displayed and a non-display area PA where an image is not displayed.

The display area DA includes a first substrate (100) which has a plurality of gate lines $G_1$ to $G_n$, a plurality of data lines $D_1$ to $D_m$, switching elements (Q), and pixel electrodes (PE) formed thereon, a second substrate (200) which has color filters (CF) and a common electrode (CE) formed thereon, and a liquid crystal layer (150) interposed between the first substrate (100) and the second substrate (200), such that an image is displayed. The gate lines $G_1$ to $G_n$ extend in a row direction as to be substantially parallel to one another, and the data lines $D_1$ to $D_m$ extend in a column direction to be substantially parallel to one another, as illustrated in FIGS. 1 and 2.

Referring to FIG. 2, the color filter CF may be formed on a portion of the common electrode CE of the second substrate 200 in such a manner that the color filter CF faces the pixel electrode PE of the first substrate 100. Further, the pixel PX which is connected to an i-th (where i=1 to n) gate line Gi and a j-th (where j=1 to m) data line Dj includes the switching element Q which is connected to the signal lines Gi and Dj, and a liquid crystal capacitor $C_{lc}$ and a storage capacitor $C_{st}$ which are connected to the switching element Q. In alternative exemplary embodiments, the storage capacitor $C_{st}$ may be omitted. The switching element Q is a thin film transistor ("TFT") which is formed of amorphous-silicon ("a-Si").

As illustrated in FIG. 2, the non-display area PA is a portion in a region of the outer periphery of the liquid crystal panel 300 where an image is not displayed due to the first substrate 100 being larger than the second substrate 200.

Referring again to FIG. 1, the data driver 700 receives an image signal DAT and a data control signal CONT from the timing controller 500, and supplies an image data voltage corresponding to the image signal DAT to each of the data lines $D_1$ to $D_m$. The data control signal CONT controls the operation of the data driver 700, and includes, for example, a horizontal start signal (not shown) for starting an operation of the data driver 700 and a load signal (not shown) for instructing an output of two data voltages, but is not limited thereto.

The gate driver 400 receives a first clock signal CKV, a second clock signal CKVB, a second scan start signal STVP, and a gate off voltage Voff from the clock generator 600, and supplies gate signals to the plurality of gate lines $G_1$ to $G_n$.

Hereinafter, the gate driver 400 according an exemplary embodiment of the present invention will be described in further detail with reference to FIGS. 3 and 4. Alternative exemplary embodiments are not limited to the structure or components shown in FIGS. 3 and 4.

Figure 3:
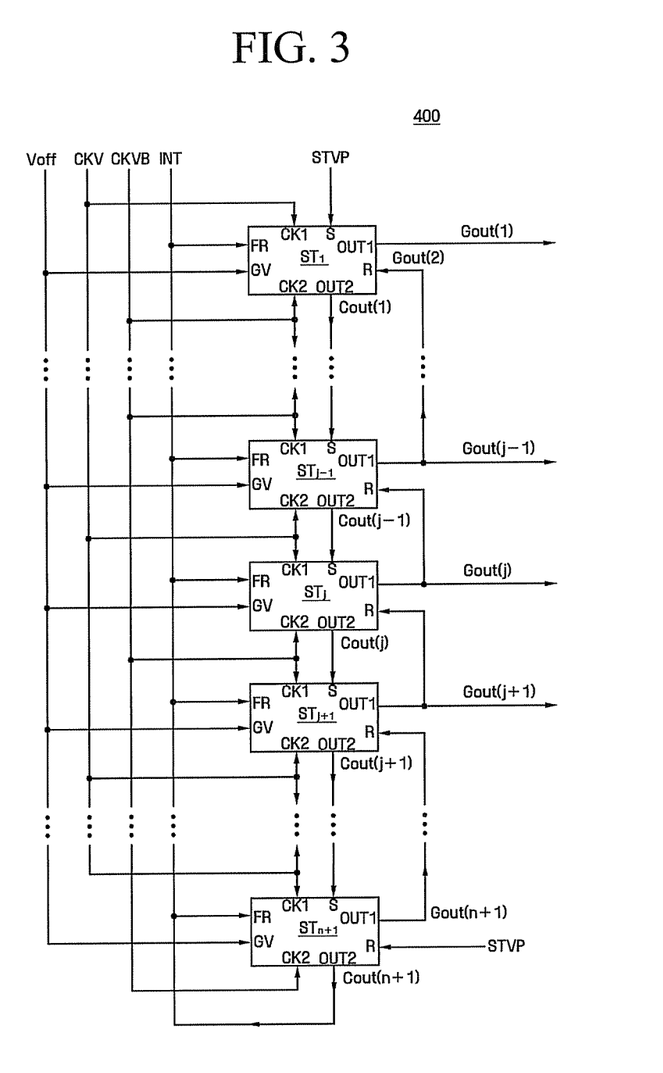
FIG. 3 is a block diagram of a gate driver of the liquid crystal display of FIG. 1 according to an exemplary embodiment of the present invention.
Figure 4:
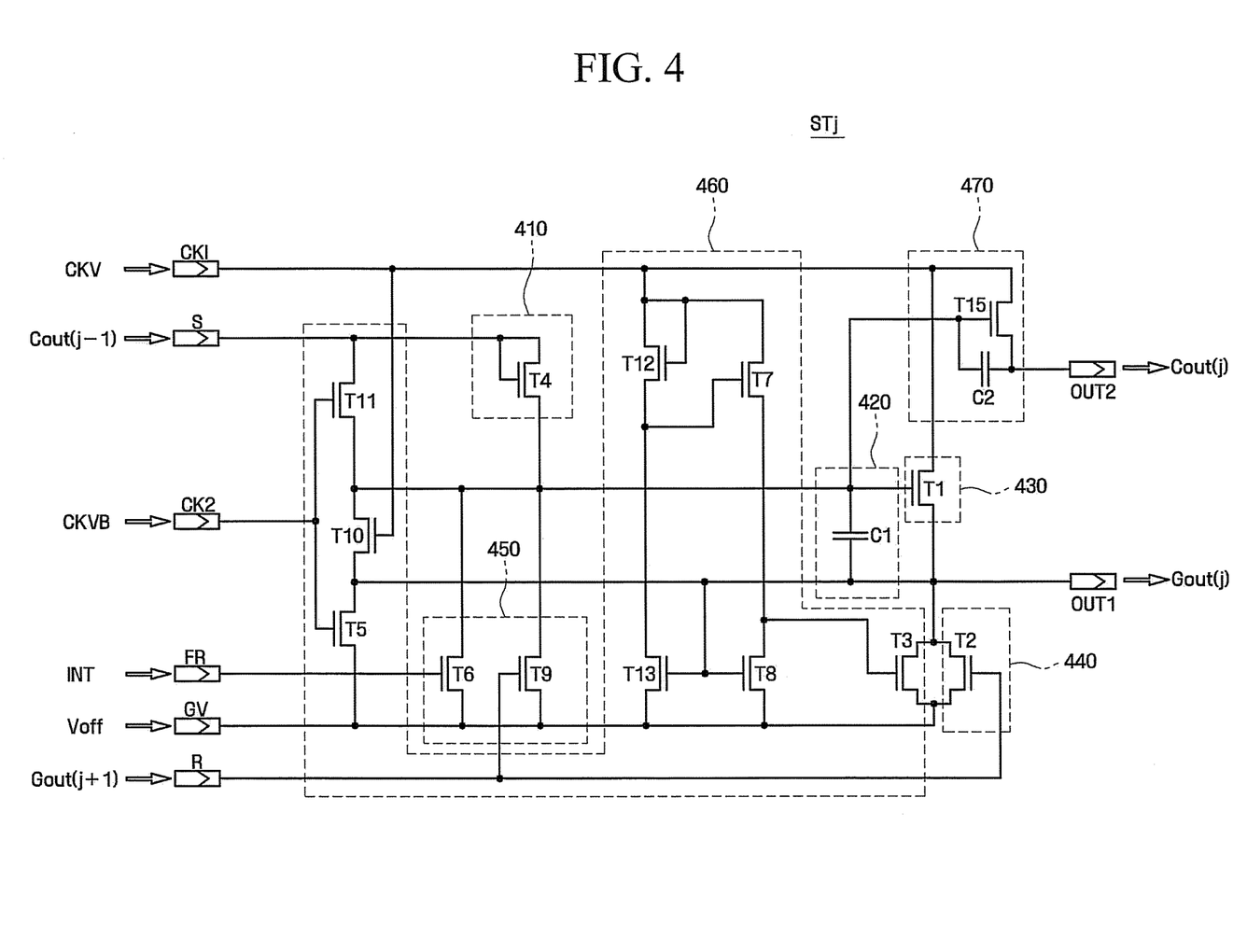
FIG. 4 is a schematic circuit diagram of a j-th stage of the gate driver of FIG. 3 according to an exemplary embodiment of the present invention.

FIG. 3 is a block diagram of the gate driver 400 of the liquid crystal display 10 of FIG. 1 according to an exemplary embodiment of the present invention, and FIG. 4 is a schematic circuit diagram of a j-th stage of the gate driver 400 of FIG. 3 according to an exemplary embodiment of the present invention.

Referring to FIG. 3, the gate driver 400 includes at least one a-Si TFT (not shown). Furthermore, the gate driver 400 includes a plurality of stages $ST_1, \ldots,$ and $ST_{n+1}$. The stages $ST_1, \ldots,$ and $ST_{n+1}$ are connected to one another in a cascade manner, as illustrated in FIG. 3, and sequentially output gate signals Gout1, ..., and Gout(n+1). The gate off voltage Voff, the first clock signal CKV, the second clock signal CKVB and an initializing signal INT are input to each of the stages $ST_1, \ldots,$ and $ST_{n+1}$. Each of the stages except for a final stage $ST_{n+1}$ is connected to a respective corresponding gate line of each of the plurality of gate lines $G_1$ to $G_n$ of the liquid crystal panel (FIG. 1). According to exemplary embodiments described herein, the first clock signal CKV and the second clock signal CKVB have variable duty ratios which provide an advantage of effectively reducing or preventing erroneous operation of the gate driver 400 regardless of a frame frequency of the liquid crystal display.

Each of the stages $ST_1, \ldots,$ and $ST_{n+1}$ includes a first clock terminal CK1, a second clock terminal CK2, a set terminal S, a reset terminal R, a power supply voltage terminal GV, a frame rest terminal FR, a gate output terminal OUT1, and a carry output terminal OUT2.

More specifically, and for purposes of further illustration, among the stages $ST_1, \ldots,$ and $ST_{n+1}$, a j-th stage $ST_j$, for example, includes a set terminal S to which a carry signal Cout(j−1) of a previous stage $ST_{j−1}$ is input, a reset terminal R to which a gate signal Gout(j+1) of a next stage $ST_{j+1}$ is input, a first clock terminal CK1 and a second clock terminal CK2 to which the first clock signal CKV and the second clock signal CKVB are input, respectively, a power supply voltage terminal GV to which the gate off voltage Voff is input, and a frame reset terminal FR to which the initializing signal INT is input. The j-th stage $ST_j$ has a gate output terminal OUT1 through which a gate signal $Gout_1$ is output, and a carry output terminal OUT2 through which the carry signal Cout(j) is output. A carry signal Cout(n+1) of the final stage $ST_{n+1}$ is supplied to the frame reset terminal FR of each of the stages $ST_1, \ldots,$ and $ST_{n+1}$.

To prevent an unstable oscillation condition of the stages $ST_1, \ldots,$ and $ST_{n+1}$, the second scan start signal STVP is input to the first stage $ST_1$ instead of the carry signal of the previous stage and the second scan start signal STVP is input to the final stage $ST_{n+1}$ instead of the gate signal of the next stage.

The j-th stage $ST_j$ of the gate driver 400 shown in FIG. 3 will now be described in further detail with reference to FIG. 4.

The j-th stage $ST_j$ includes a buffer unit 410, a charge unit 420, a pull-up unit 430, a carry signal generator 470, a pull-down unit 440, a discharge unit 450 and a holding unit 460.

The buffer unit 410 supplies the carry signal Cout(j−1) of the previous stage $ST_{n−1}$, which is input to both a drain and a gate of a transistor T4 through the set terminal S, to the charge unit 420, the carry signal generator 470, the discharge unit 450, and the holding unit 460, which are connected to a source of the transistor T4.

The charge unit 420 includes a capacitor C1 having one terminal connected to the source of the transistor T4 and the discharge unit 450 and an other terminal connected to the gate output terminal OUT1. The charge unit 420 is charged with charges according to the carry signal Cout(j−1) of the previous stage $ST_{n−1}$.

A duty ratio of the carry signal Cout(j−1) of the previous stage $ST_{n−1}$ varies in direct relationship to duty ratios of the first clock signal CKV and the second clock signal CKVB. For example, when the duty ratios of the first clock signal CKV and the second clock signal CKVB increase, the duty ratio of the carry signal Cout(j−1) of the stage $ST_{n−1}$ increases. Conversely, when-the duty ratios of each of the first clock signal CKV and the second clock signal CKVB decrease, the duty ratio of the carry signal Cout(j−1) of the stage $ST_{n−1}$ decreases.

When the frame frequency of the liquid crystal display is at a low frequency with respect to other frame frequencies of the liquid crystal display, a time when the first clock signal CKV and the second clock signal CKVB are at a high level during one period is longer as compared to when the frame frequency of the liquid crystal display is relatively higher. Therefore, a time when the carry signal Cout(j−1) of the previous stage $ST_{n−1}$ is at a high level during one period also becomes longer. As a result, a large amount of charges are charged in the charge unit 420. In contrast, when the frame frequency of the liquid crystal display is at a high frequency, the time when each of the first clock signal CKV and the second clock signal CKVB is at the high level during one period becomes shorter as compared when the frame frequency is at the low frequency with respect to other frame frequencies of the liquid crystal display, a relatively smaller amount of charges are charged in the charge unit 420.

The amount of charges in the charge unit 420 determines whether the pull-up unit 430 is on or off, e.g., whether transistor T1 is gated on or off, respectively. When the frame frequency of the liquid crystal display is at the relatively low frequency described above, a corresponding relatively large amount of charges are charged in the charge unit 420, and the pull-up unit 430 is easily turned on. Conversely, when the frame frequency is at the relatively high frequency described above, a relatively small amount of charges are charged in the charge unit 420, and thus the pull-up unit 430 is not turned on as easily. As a result of the pull-up unit being turned on more or less easily depending upon the frame frequency of the liquid crystal, operation of the pull-up unit 430 is unstable and/or unpredictable. To compensate for this, an exemplary embodiment of the present invention supplies the first clock signal CKV and the second clock signal CKVB to the gate driver 400, and the elapsed time when the first clock signal CKV and the second clock signal CKVB are at a high level during one period is constant regardless of the frame frequency of the liquid crystal display. Therefore, the amount of charges which are charged in the charge unit 420 remains constant and the pull-up unit 430 is turned on in a predictable and stable manner.

The pull-up unit 430 includes the transistor T1 having a drain connected to the first clock terminal CK1, a gate connected to the one terminal of the capacitor C1 and a source connected to the other terminal of the capacitor C1 and the gate output terminal OUT1 as illustrated in FIG. 4. When the capacitor C1 of the charge unit 420 is sufficiently charged with the charges, the transistor T1 turns on, and the first clock signal CKV which is input through the first clock terminal CK1 is supplied to the plurality of gate lines $G_1$ to $G_n$ (FIG. 1) as the gate signal Gout(j) through the gate output terminal OUT1.

As described above, when the frame frequency of the liquid crystal display is at the relatively low frequency, a relatively large amount of charge is charged in the charge unit 420, and the pull-up unit 430 is more easily turned on. Further, when temperature increases, charge mobility increases and the pull-up unit 430 may be turned on due to noise, resulting in output of the gate signal Gout(j) several times during one frame which causes degradation in picture quality of the liquid crystal display. However, as described herein, in an exemplary embodiment of the present invention, the elapsed time when the first clock signal CKV and the second clock signal CKVB are at the high level during one period remains constant regardless of the frame frequency of the liquid crystal display, and the amount of charges which are charged in the charge unit 420 remains constant, reducing or effectively preventing erroneous operation of the gate driver 400 due to the pull-up unit 430 turning on due to noise. The time when the first clock signal CKV and second clock signal CKVB are at the high level during one period is determined as described hereinafter in further detail.

Referring again to FIG. 4, the carry signal generator 470 includes a transistor T15 which has a drain connected to the first clock terminal CK1, a source connected to the carry output terminal OUT2 and a gate connected to the buffer unit 410, and a capacitor C2 which is connected to the gate and the source of the transistor T15. The capacitor C2 is charged in the same manner as described above in reference to the charge unit 420. When the capacitor C2 is charged, the transistor T15 turns on and outputs the first clock signal CKV as the carry signal Cout(j) to the set terminal S of stage $ST_{j+1}$ through the carry output terminal OUT2.

The pull-down unit 440 includes a transistor T2 which has a drain connected to the source of the transistor T1 and the other terminal of the capacitor C1, a source connected to the power supply voltage terminal GV and a gate connected to the reset terminal R. The pull-down unit 440 is turned on according to the gate signal Gout(j+1) of the next stage $ST_{j+1}$ which is input through the reset terminal R, and pulls down the gate signal Gout(j) to the gate off voltage Voff.

The discharge unit 450 includes a transistor T9 and a transistor T6. The transistor T9 has a gate connected to the reset terminal R, a drain connected to the one terminal of the capacitor C1, and a source connected to the power supply voltage terminal GV, and discharges the charge unit 420 in response to the gate signal Gout(j+1) of the next stage $ST_{j+1}$.

The transistor T6 has a gate connected to the frame reset terminal FR, a drain connected to the one terminal of the capacitor C1, and a source connected to the power supply voltage terminal GV, and discharges the charge unit 420 in response to the initializing signal INT.

In the holding unit 460, when the gate signal Gout(j) is at the high level, a transistor T3 remains turned off and performs a holding operation which holds Gout(j) at the high level. When the gate signal Gout(j) changes from the high level to a low level, the transistor T3 and a transistor T5 are turned on and perform a holding operation which holds Gout(j) at the low level.

More specifically, the transistor T3 includes a drain connected to the gate output terminal OUT1 and a source connected to the gate off voltage Voff. Transistors T13 and T8 are turned on when the gate signal Gout(j), which is output through the gate output terminal OUT1, is at a high level, and pull down the gate of the transistor T3 and a transistor T7 to the gate off voltage Voff to turn off the transistors T3 and T7. Therefore, the high level of the gate signal Gout(j) is held at the high level. When the gate signal Gout(j) changes to a low level, the transistors T8 and T13 are turned off and the transistors T3 and T5 are turned on to hold the gate signal Gout(j) at the low level. That is to say, when the second clock signal CKVB is at a high level, the gate signal Gout(j) is at a low level, and the transistor T5 is turned on and performs the holding operation such that the gate output terminal OUT1 is held at the gate off voltage Voff. And when the first clock signal CKV is at a high level, transistors T3 and T7 and are turned on, since transistors T12 supplies the first clock signal CKV to a gate of transistor T7, so the gate output terminal OUT1 is held at the gate off voltage Voff.

A transistor T11 includes a drain connected to the set terminal S, a gate connected to the second clock terminal CK2, and a source connected to the one terminal of the capacitor C1. A transistor T10 includes a drain connected to the source of the transistor T11 and the one terminal of the capacitor C1, a gate connected to the first clock terminal CK1, and a source connected to the gate output terminal OUT1. A transistor T5 includes a drain connected to the gate output terminal OUT1, a gate connected in common to the second clock terminal CK2 together with the gate of the transistor T11, and a source connected to the power supply voltage terminal GV.

Referring once again to FIG. 1, the timing controller 500 receives input image signals R, G and B from a graphic controller (not shown) and input control signals which control display of the input image signals R, G and B. The input control signals may include a vertical synchronization signal $V_{sync}$, a horizontal synchronization signal $H_{sync}$, a main clock signal $M_{clk}$ and a data enable signal DE, for example, but are not limited thereto. A frequency of the main clock signal $M_{clk}$ is determined according to the frame frequency of the liquid crystal display discussed above.

The timing controller 500 generates the data control signal CONT on the basis of the input image signals R, G and B and the input control signals, and supplies the data control signal CONT and the image data DAT to the data driver 700.

Further, the timing controller 500 supplies a first clock generation control signal OE, a second clock generation control signal CPV, and a first scan start signal STV to the clock generator 600. The first clock generation control signal OE is a gate enable signal which enables the gate signal, the first scan start signal STV is a signal which indicates and/or initiates the start of one frame, and the second clock generation control signal CPV is a gate clock signal which determines a duty ratio of the gate signal. The second clock generation control signal CPV has a variable duty ratio.

The clock generator 600 receives the first clock generation control signal OE, the second clock generation control signal CPV and the first scan start signal STV, and supplies the first clock signal CKV, the second clock signal CKVB, the second scan start signal STVP and the gate off voltage Voff to the gate driver 400.

In general, a frequency and a duty ratio of the second clock generation control signal CPV are determined by the frame frequency of the liquid crystal display. For example, the time when the second clock generation control signal CPV is at the high level during one period is determined according to the frame frequency. However, in an exemplary embodiment of the present invention, the time when the second clock generation control signal CPV is at the high level during one period remains constant regardless of the frame frequency. As described above, in order to prevent erroneous operation of the gate driver 400, the time when the first clock signal CKV and the second clock signal CKVB are at the high level during one period is also constant. The first clock signal CKV and the second clock signal CKVB are generated by the first clock generation control signal OE and the second clock generation control signal CPV, respectively. Further, the time when the second clock generation control signal CPV which is outputted by the timing controller 500 is at the high level is constant regardless of the frame frequency.

The duty ratios of each of the first clock signal CKV and the second clock signal CKVB vary according to the duty ratio of the second clock generation control signal CPV. For example, when the duty ratio of the second clock generation control signal CPV increases, the duty ratio of each of the first clock signal CKV and the second clock signal CKVB increases. Further, when the duty ratio of the second clock generation control signal CPV decreases, the duty ratio of each of the first clock signal CKV and the second clock signal CKVB decreases. As a result, when the timing controller 500 supplies the second clock generation control signal CPV and the time when the second clock generation control signal CPV is at the high level during one period is constant regardless of the frame frequency, the clock generator 600 generates the first clock signal CKV and the second clock signal CKVB, and the time when each of the first clock signal CKV and the second clock signal CKVB is at the high level during one period is also constant.

Put another way, the timing controller 500 controls the duty ratio of the second clock generation control signal CPV regardless of the frame frequency at which the liquid crystal display is operating, and the clock generator 600 supplies the first clock signal CKV and the second clock signal CKVB according to the second clock generation control signal CPV. Therefore, erroneous operation of the gate driver 400 is prevented regardless of the frame frequency at which the liquid crystal display operates.

Figure 5:
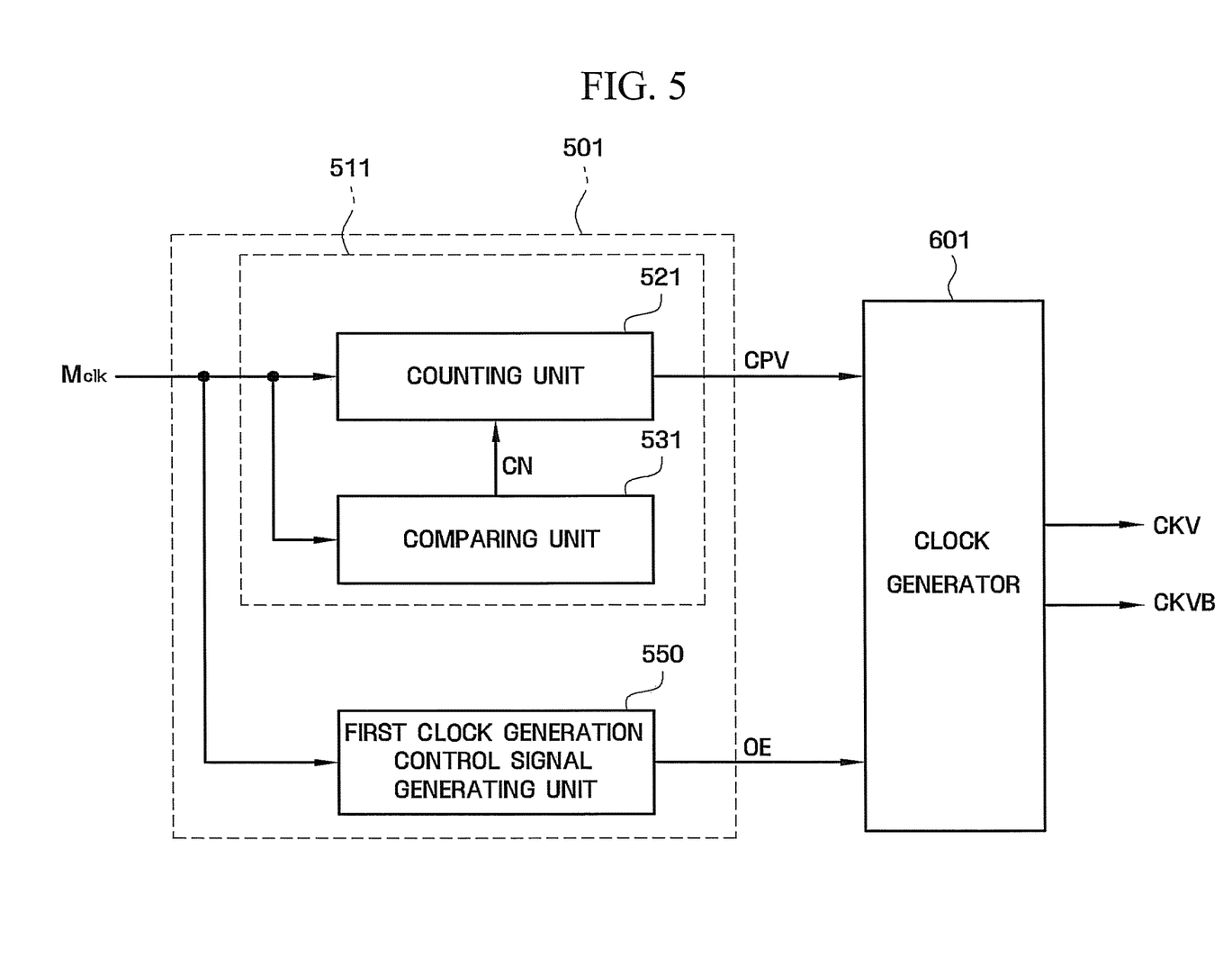
FIG. 5 is a block diagram of a timing controller of a liquid crystal display according to an exemplary embodiment of the present invention.
Figure 8:
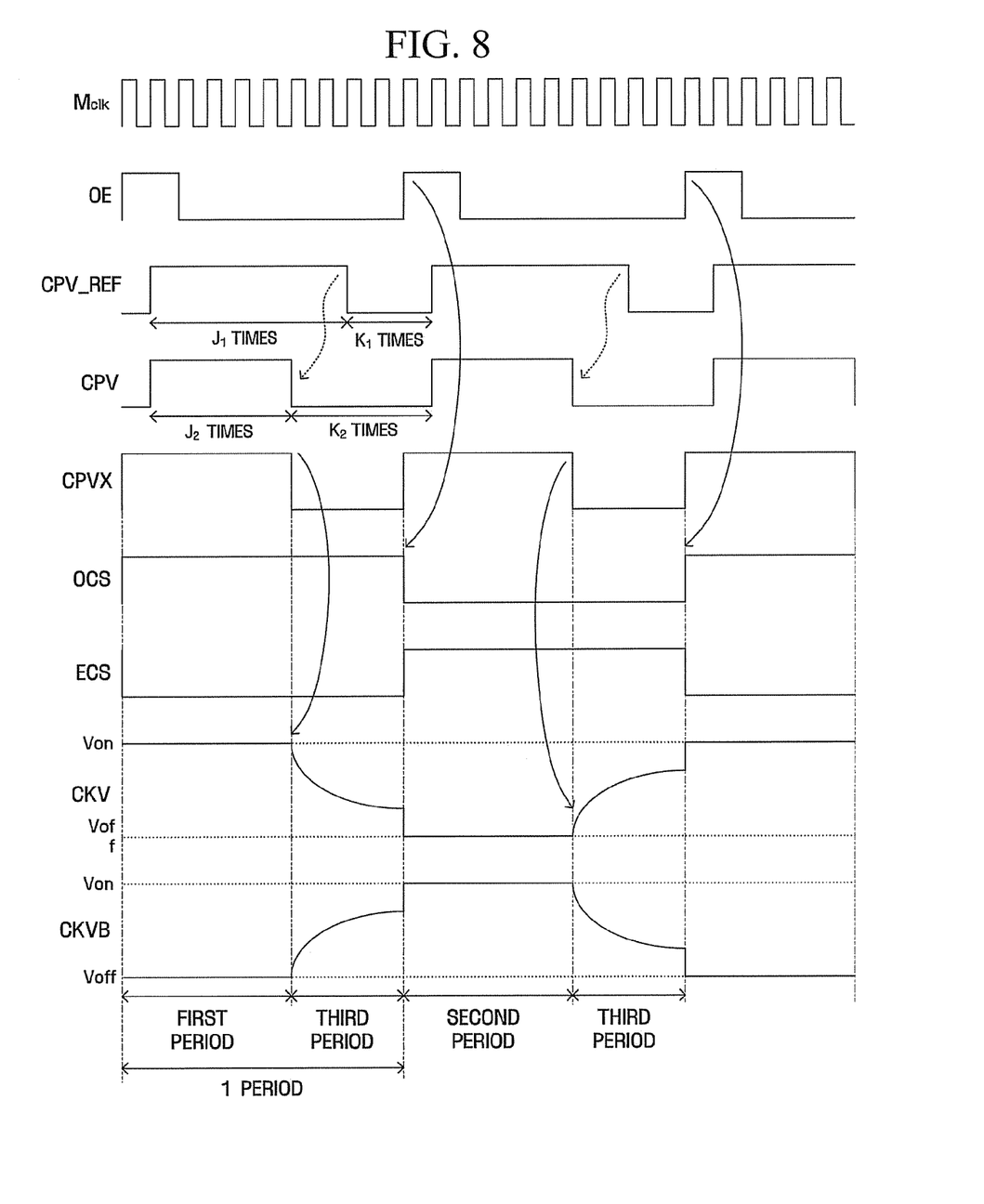
FIGS. 8 and 9 are signal waveform timing charts illustrating an operation of the timing controller and the clock generator of FIGS. 5 and 6, respectively, according to an exemplary embodiment of the present invention.
Figure 9:
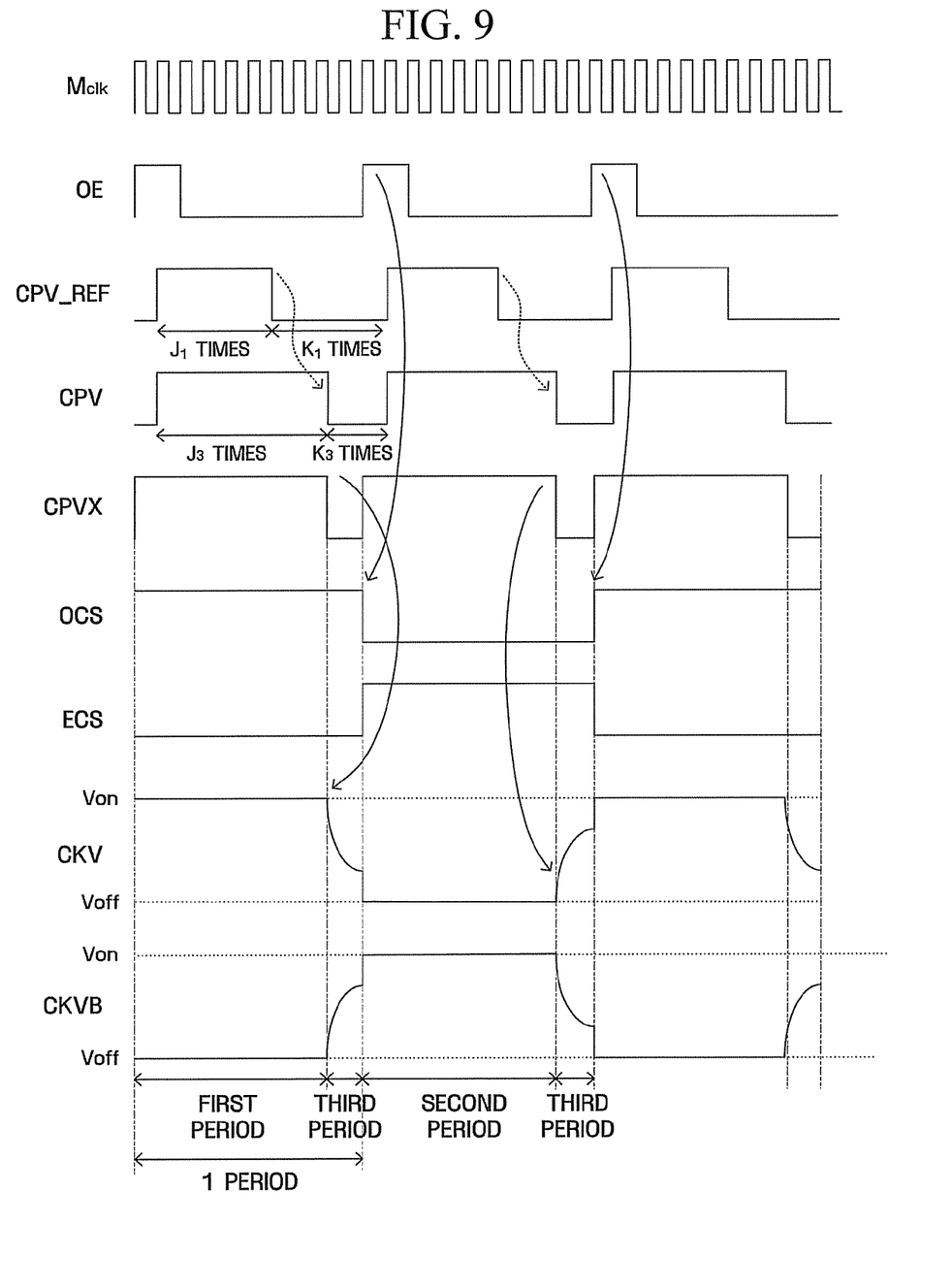

Hereinafter, the timing controller 500 and the clock generator 600 according to exemplary embodiments of the present invention will be described in further detail with reference to FIGS. 5, 8 and 9. FIG. 5 is a block diagram of a timing controller of a liquid crystal display according to an exemplary embodiment of the present invention. FIGS. 8 and 9 are signal waveform timing charts illustrating an operation of a timing controller and a clock generator according to an exemplary embodiment of the present invention as shown in FIG. 5.

In general, a frequency and a duty ratio of the main clock signal $M_{clk}$ and the second clock generation control signal CPV are determined according to the frame frequency of the liquid crystal display, and the duty ratios of each of the first clock signal CKV and the second clock signal CKVB are thereby determined based upon the frequency and duty ratio of the main clock signal $M_{clk}$. For example in one exemplary embodiment, when the frequency of the main clock signal $M_{clk}$ is determined according to the frame frequency, a time when a second clock generation control reference signal CPV_REF is at a high level and a time when the second clock generation control reference signal CPV_REF is at a low level during one period are determined according to a number of rising edges of the main clock signal $M_{clk}$. Referring to FIGS. 8 and 9, counting numbers $J_1$ and $K_1$ are previously set in a general timing controller (not shown) such that the second clock generation control reference signal CPV_REF is at the high level during a time in which the rising edges of the main clock signal $M_{clk}$ are counted on the basis of a counting number $J_1$ and at the low level during a time in which the rising edges of the main clock signal $M_{clk}$ are counted on the basis of the counting number $K_1$. Therefore, a time when the second clock generation control reference signal CPV_REF is at the high and low levels is determined according to the frequency of the main clock signal $M_{clk}$ and the previously set reference counting numbers $J_1$ and $K_1$ (hereinafter referred to as "reference counting numbers").

More specifically, in order to control the time when the second clock generation control signal CPV is at a high level during one period to minimize erroneous operation of the gate driver, the frequency of the main clock signal $M_{clk}$ is measured, and counting numbers $J_2$, $K_2$, $J_3$ and $K_3$ corresponding to rising edges or falling edges of the main clock signal $M_{clk}$ are generated to determine a frequency of the main clock signal at which erroneous operation of the gate driver is minimized (hereinafter, referred to as "first reference frequency") is determined. More specifically, the frequency of the main clock signal $M_{clk}$ being input is measured, and when the frequency of the main clock signal $M_{clk}$ is less than the first reference frequency, the counting number (e.g., $J_2$, $K_2$, $J_3$ and $K_3$) decreases such that the elapsed time decreases when the second clock generation control signal CPV is at the high level during one period, as shown in FIG. 8. Alternatively, when the frequency of the main clock signal $M_{clk}$ being input is greater than the first reference frequency, the counting number (e.g., $J_2$, $K_2$, $J_3$ and $K_3$) increases, such that the elapsed time increases when the second clock generation control signal CPV is at the high level during one period, as shown in FIG. 9.

Referring to FIGS. 5 and 8, a process of outputting a second clock generation control signal CPV when a frequency of a main clock signal $M_{clk}$ is less than the first reference frequency will be described hereinafter in further detail.

A timing controller 501 includes a first clock generation control signal generating unit 550 and a second clock generation control signal generating unit 511.

When the main clock signal $M_{clk}$ is supplied, the first clock generation control signal generating unit 550 outputs a first clock generation control signal OE according to the main clock signal $M_{clk}$. By counting rising edges or falling edges of the main clock signal $M_{clk}$, a period of a high level or a low level is determined.

A comparing unit 531 receives the main clock signal $M_{clk}$, compares the frequency of the main clock signal $M_{clk}$ with the first reference frequency described above, and supplies a counting control signal CN to a counting unit 521. When the frequency of the main clock signal $M_{clk}$ is less than the first reference frequency, the comparing unit 531 supplies the counting unit 521 with the counting control signal CN which corresponds to the counting number of $J_2$, which is less than the reference counting number $J_1$, as illustrated in FIG. 8.

The counting unit 521 counts the main clock signal $M_{clk}$ on the basis of the previously set reference counting numbers $J_1$ and $K_1$ and outputs the second clock generation control reference signal CPV_REF. The counting unit 521 receives the counting control signal CN from the comparing unit 531 and outputs the second clock generation control signal CPV which is at a high level during a time in which the rising edges of the main clock signal $M_{clk}$ are counted on the basis of the counting number $J_2$ and at the low level during a time in which the rising edges of the main clock signal $M_{clk}$ are counted on the basis of the counting number $K_2$, which is greater than the counting number $K_1$, as illustrated in FIG. 8. As a result, the second clock generation control signal generating unit 511 outputs the second clock generation control signal CPV having a duty ratio which decreases when the frequency of the main clock signal $M_{clk}$ is less than the first reference frequency.

Hereinafter, a process of outputting the second clock generation control signal CPV having a duty ratio which increases when a frequency of the main clock signal $M_{clk}$ is greater than the first reference frequency will be described in further detail with reference to FIGS. 5 and 9.

The comparing unit 531 compares the previously stored first reference frequency with the frequency of the main clock signal $M_{clk}$. The frequency of the main clock signal $M_{clk}$ is determined by counting the rising edges or falling edges of the main clock signal $M_{clk}$ per unit of time. When the frequency of the main clock signal $M_{clk}$ is greater than the first reference frequency, the comparing unit 531 supplies the counting unit 521 with the counting control signal CN which corresponds to a counting number $J_3$ which is greater than the reference counting number $J_1$.

The counting unit 521 counts the main clock signal $M_{clk}$ on the basis of the previously set counting numbers $J_1$ and $K_1$ and outputs the second clock generation control reference signal CPV_REF. The counting unit 521 receives the counting control signal CN from the comparing unit 531 and outputs the second clock generation control signal CPV which is at a high level during a time in which the rising edges of the main clock signal $M_{clk}$ are counted on the basis of the counting number $J_3$ and at a low level during a time in which the rising edges of the main clock signal $M_{clk}$ are counted on the basis of the counting number $K_3$, as illustrated in FIG. 9. As a result, the second clock generation control signal generating unit 511 outputs the second clock generation control signal CPV having a duty ratio which increases when the frequency of the main clock signal $M_{clk}$ is greater than the first reference frequency.

In summary, the timing controller 501 outputs the second clock generation control signal CPV such that the time when the second clock generation control signal CPV is at a high level during one period is constant. Therefore, the timing controller supplies a clock generator 601 with the second clock generation control signal CPV which is capable of minimizing erroneous operation of the gate driver 400 (FIG. 1).

Hereinafter, the clock generator 601 which generates a first clock signal CKV and a second clock signal CKVB using the second clock generation control signal CPV having a duty ratio which is controlled as described above will be described in further detail with reference to the accompanying drawings.

Figure 6:
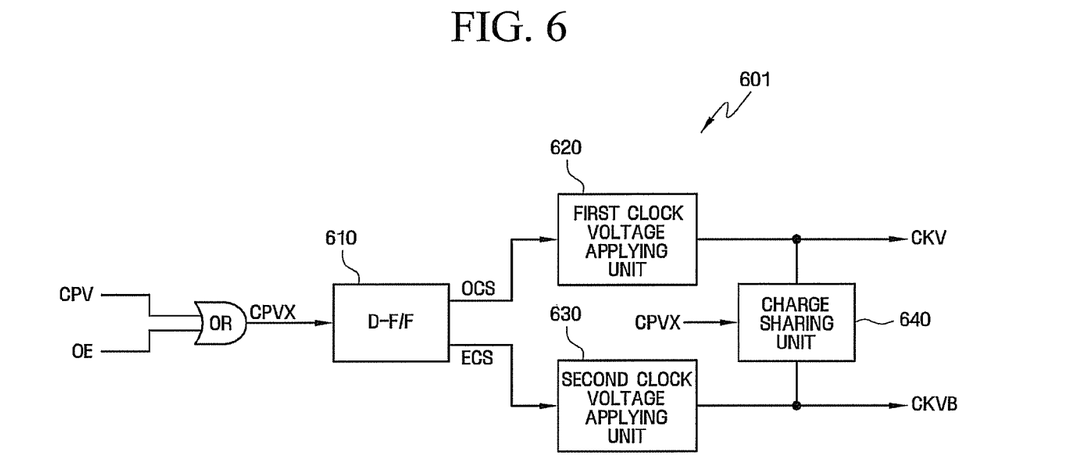
FIG. 6 is a block diagram of a clock generator of a liquid crystal display according to an exemplary embodiment of the present invention.
Figure 7:
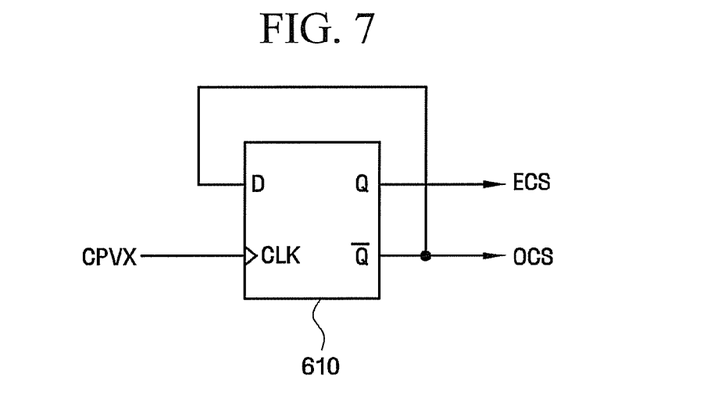
FIG. 7 is a block diagram of a D flip-flop of the clock generator of FIG. 6 according to an exemplary embodiment of the present invention.

FIG. 6 is a block diagram of a clock generator of a liquid crystal display according to an exemplary embodiment of the present invention. FIG. 7 is a block diagram of a D flip-flop of the clock generator of FIG. 6 according to an exemplary embodiment of the present invention.

First, a process of generating the first clock signal CKV and the second clock signal CKVB when a frequency of the main clock signal $M_{clk}$ is less than the first reference frequency will be described with reference to FIGS. 6 through 8.

The clock generator 601 includes an OR operator OR, a D flip-flop 610, a first clock voltage applying unit 620, a second clock voltage applying unit 630, and a charge sharing unit 640. In alternative exemplary embodiments of the present invention, an internal circuit of the clock generator 601 is not limited to the components described herein.

The OR operator OR receives the first clock generation control signal OE and the second clock generation control signal CPV, performs an OR operation on the received signals and generates a third clock generation control signal CPVX. The OR operator OR supplies the generated third clock generation control signal CPVX to the D flip-flop 610.

As shown in FIG. 7, the D flip-flop 610 has a clock terminal CLK to which the third clock generation control signal CPVX is input, an output terminal Q, an input terminal D and an output bar terminal $\overline{Q}$ which are connected to each other. Therefore, a second clock enable signal ECS which toggles at every rising edge of the third clock generation control signal CPVX is output through the output terminal Q, and a first clock enable signal OCS which has an opposite phase to the second clock enable signal ECS is output through the output bar terminal $\overline{Q}$.

The first clock enable signal OCS is supplied to the first clock voltage applying unit 620, and the second clock enable signal ECS is supplied to the second clock voltage applying unit 630.

The first clock voltage applying unit 620 is enabled by the first clock enable signal OCS, and outputs the first clock signal CKV which is at a high level Von while the first clock enable signal OCS is at a high level (as illustrated in a first period shown in FIG. 8) and at a low level Voff while the first clock enable signal OCS is at a low level (as illustrated in a second period shown in FIG. 8). Further, the second clock voltage applying unit 630 is enabled by the second clock enable signal ECS and outputs the second clock signal CKVB which is at the high level Von while the second clock enable signal ECS is at a high level (as illustrated in the second period shown in FIG. 8) and at the low level Voff while the second clock enable signal ECS is at a low level (as illustrated in the first period shown in FIG. 8).

The charge sharing unit 640 receives the third clock generation control signal CPVX and shares the charges when the first clock signal CKV and the second clock signal CKVB charge and discharge.

More specifically, as shown in FIG. 8, during the first period, the first clock signal CKV is at the high level Von, and the second clock signal CKVB is at the low level Voff. When the third clock generation control signal CPVX becomes a low level, the first clock signal CKV starts to discharge, and the second clock signal CKVB starts to charge, as illustrated in a third period as shown in FIG. 8. During the third period, while the charges are shared by the charge sharing unit 640, the first clock signal CKV discharges and transitions to the low level Voff, and the second clock signal CKVB charges with charges supplied from the first clock signal CKV and transitions to the high level Von.

Then, the second period, the first clock signal CKV becomes the low level Voff, and the second clock signal CKVB becomes the high level Von. Next, during a subsequent third period, while the charges are shared again, the first clock signal CKV starts to charge, and the second clock signal CKVB starts to discharge. The duration of the third period is controlled by a duty ratio of the third clock generation control signal CPVX. When the duty ratio of the third clock generation control signal CPVX increases, the third period decreases and the first and second period durations increase relative to the duration of the third period. Alternatively, when the duty ratio of the third clock generation control signal CPVX decreases, the third period increases and the first and second periods therefore decrease with respect to the third period. In this manner, the duty ratio of the third clock generation control signal CPVX determines the duty ratio of each of the first clock signal CKV and the second clock signal CKVB.

Alternatively, when the frequency of the main clock signal $M_{clk}$ is greater than the first reference frequency, the duty ratio of the second clock generation control signal CPV increases, and thus the duty ratio of the third clock generation control signal CPVX increases, as illustrated in FIG. 9. Since the period during which the third clock generation control signal CPVX is at the low level decreases, the third period during which the charges are shared decreases, and the first period and the second period increase. In this manner, the duty ratio of each of the first clock signal CKV and the second clock signal CKVB increases.

Therefore, regardless of the frame frequency, the duty ratio of each of the first clock signal CKV and the second clock signal CKVB varies such that the time when each of the first clock signal CKV and the second clock signal CKVB is at the high level during one period remains constant, effectively preventing or reducing erroneous operation of the gate driver.

Figure 10:
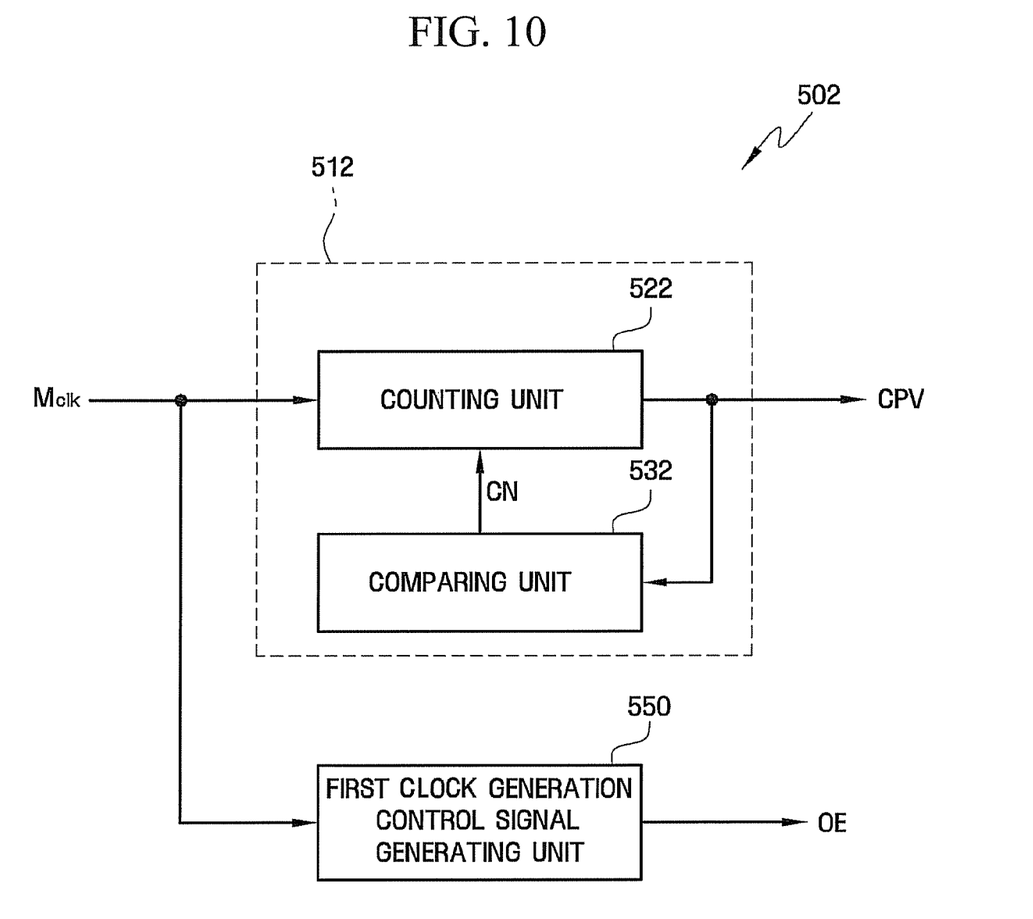
FIG. 10 is a block diagram illustrating a timing controller of a liquid crystal display according to an alternative exemplary embodiment of the present invention.

Hereinafter, a liquid crystal display according to an alternative exemplary embodiment of the present invention will be described with reference to FIG. 10. FIG. 10 is a block diagram of a timing controller of a liquid crystal display according to an exemplary embodiment of the present invention.

As discussed above with respect to one exemplary embodiment, the frequency of the main clock signal $M_{clk}$ is compared with the first reference frequency such that the duty ratio of the second clock generation control signal CPV is controlled. However, in alternative exemplary embodiments, the frequency of the second clock generation control signal CPV is compared with a second reference frequency such that the duty ratio of the second clock generation control signal CPV is controlled. Specifically, the second reference frequency is a frequency of the second clock generation control signal CPV which minimizes erroneous operation of the gate driver.

A timing controller 502 according to an alternate exemplary embodiment of the present invention includes a first clock generation control signal generating unit 550 and a second clock generation control signal generating unit 512.

More specifically, referring to FIG. 10, a counting unit 522 receives a counting control signal CN which corresponds to a reference counting number from a comparing unit 532 and outputs a second clock generation control signal CPV which is at a high level or a low level.

The comparing unit 532 receives the second clock generation control signal CPV. When a frequency of the second clock generation control signal CPV is less than the second reference frequency, the comparing unit 532 supplies the counting control signal CN which indicates a counting number less than the reference counting number. When the frequency of the second clock generation control signal CPV is greater than the second reference frequency, the comparing unit 532 supplies the counting control signal CN which indicates a counting number greater than the second reference counting number.

The counting unit 522 outputs the second clock generation control signal CPV which is at a high level while counting rising edges or falling edges of the main clock signal $M_{clk}$ according to the counting control signal CN which is supplied from the comparing unit 532. The counting unit 522 decreases a duty ratio of the second clock generation control signal CPV when the frequency of the second clock generation control signal CPV is less than the second reference frequency. When the frequency of the second clock generation control signal CPV is greater than the second reference frequency, the counting unit 522 increases the duty ratio of the second clock generation control signal CPV. Therefore, the counting unit 522 outputs the second clock generation control signal CPV having a duty ratio which is variable and therefore effectively prevents or minimizes erroneous operation of the gate driver as discussed earlier.

As described herein, a liquid crystal display according to exemplary embodiments of present the invention effectively prevents or reduces erroneous operation of a gate driver regardless of a frame frequency of the liquid crystal display. As a result, display quality of the liquid crystal display is improved.

Although the present invention has been described in connection with exemplary embodiments described above, the present invention should not be construed as being limited to the exemplary embodiments set forth herein. Rather, these exemplary embodiments are provided so that this disclosure will be thorough and complete and will fully convey the concept of the present invention to those skilled in the art. Furthermore, it will be apparent to those skilled in the art that various modifications and changes may be made thereto without departing from the scope and spirit of the present invention as described in the following claims.

What is claimed is:
1. A liquid crystal display comprising:
a timing controller which receives a main clock signal and outputs a first clock generation control signal and a second clock generation control signal which has a variable duty ratio based on a frequency of the main clock signal;
a clock generator which receives the first clock generation control signal and the second clock generation control signal having a variable duty ratio and outputs a first clock signal and a second clock signal, the first clock signal and the second clock signal having different phases and duty ratios which are variable;
a gate driver which receives the first clock signal and the second clock signal and outputs gate signals which have variable duty ratios; and
a liquid crystal panel comprising a plurality of pixels which turn on based upon the gate signals and display an image,
wherein the duty ratio is duration of time for which a signal is maintained at a high level in one period of the signal.
2. The liquid crystal display of claim 1, wherein the timing controller outputs the second clock generation control signal, the duty ratio of which decreases when a frequency of the main clock signal is less than a reference frequency and increases when the frequency of the main clock signal is greater than the reference frequency.
3. The liquid crystal display of claim 2, wherein the timing controller comprises:
a comparing unit which compares the frequency of the main clock signal with the reference frequency and supplies a counting control signal which controls a counting number according to a result of the comparison; and a counting unit which outputs the second clock generation control signal at a high level while counting rising edges or falling edges of the main clock signal on the basis of the counting number which corresponds to the counting control signal.

4. The liquid crystal display of claim 3, wherein:
the comparing unit compares the frequency of the main clock signal with the reference frequency by counting the rising edges or the falling edges of the main clock signal per unit of time;
the comparing unit supplies the counting control signal which corresponds to a counting number less than a reference counting number when the frequency of the main clock signal is less than the reference frequency;
the comparing unit supplies the counting control signal which corresponds to a counting number greater than the reference counting number when the frequency of the main clock signal is greater than the reference frequency; and
the reference counting number is a previously set counting number of the rising edges or the falling edges of the main clock signal.

5. The liquid crystal display of claim 1, wherein the timing controller outputs the second clock generation control signal having a duty ratio which decreases when a frequency of the first clock generation control signal is less than a reference frequency and increases when the frequency of the first clock generation control signal is greater than the reference frequency.

6. The liquid crystal display of claim 5, wherein the timing controller comprises:
a comparing unit which compares the frequency of the second clock generation control signal with the reference frequency and supplies the counting control signal which controls the counting number according to the result of the comparison; and
a counting unit which outputs the second clock generation control signal at the high level while counting rising edges or falling edges of the main clock signal on the basis of the counting number which corresponds to the counting control signal.

7. The liquid crystal display of claim 6, wherein:
the comparing unit compares the frequency of the second clock generation control signal with the reference frequency by counting the rising edges or the falling edges of the second clock generation control signal per unit of time;
the comparing unit supplies the counting control signal which corresponds to the counting number less than a reference counting number when the frequency of the second clock generation control signal is less than the reference frequency;
the comparing unit supplies the counting control signal which corresponds to the counting number greater than the reference counting number when the frequency of the second clock generation control signal is greater than the reference frequency; and
the reference counting number is previously set by counting a number of the rising edges or the falling edges of the second clock generation control signal.

8. The liquid crystal display of claim 1, wherein:
the first and second clock signals comprise first through third periods during which the first and second clock signals have different levels from each other;
the first clock signal is at a first level during the first period, is at a second level different from the first level during the second period, and transitions from the first level to the second level or from the second level to the first level during the third period;
the second clock signal is at the second level during the first period, is at the first level during the second period, and transitions from the first level to the second level or from the second level to the first level during the third period;
the first and the second periods decrease and the third period increases when the frequency of the main clock signal is less than the reference frequency; and
the first and the second periods increase and the third period decreases when the frequency of the main clock signal is greater than the reference frequency.

9. The liquid crystal display of claim 8, wherein the third period comprises a charge sharing period during which a level of the second clock signal rises when a level of the first clock signal falls, and during which the level of the second clock signal falls when the level of the first clock signal rises.

10. The liquid crystal display of claim 8, wherein:
a third clock generation control signal comprises a signal obtained by performing an OR operation on the first clock generation control signal and the second clock generation control signal; and
the first and second clock signals are at the high level or a low level during a period in which the third clock generation control signal is at a high level;
and the first and second clock signals transition from the high level to the low level or from the low level to the high level during a period which the third clock generation control signal is at the low level.

11. The liquid crystal display of claim 10, wherein the clock generator comprises:
an OR operator which receives the first clock generation control signal and the second clock generation control signal and outputs the third clock generation control signal to a D flip-flop and a charge sharing unit;
a first clock voltage applying unit which receives the first clock enable signal and outputs the first level of the first clock signal during the first period and the second level of the first clock signal during the second period; and
a second clock voltage applying unit which receives the second clock enable signal and outputs the second level of the second clock signal during the first period and the first level of the second clock signal during the second period.

12. The liquid crystal display of claim 11, wherein:
the D flip-flop outputs a first clock enable signal having a phase which is inverted at each rising edge of the third clock generation control signal and a second clock enable signal having a phase which is opposite to the phase of the first clock enable signal; and
the charge sharing unit which receives the third clock generation control signal and controls transition of the first and second clock signals during the third period.

13. The liquid crystal display of claim 1, wherein:
the gate driver comprises a plurality of stages which sequentially output the gate signals; and
each stage of the plurality of stages comprises at least one amorphous-silicon thin film transistor (a-Si TFT).

14. The liquid crystal display of claim 1, wherein the time when the second clock generation control signal is at the high level during one period is constant regardless of a frame frequency of the liquid crystal display.

15. A method of driving a liquid crystal display, the method comprising:
receiving a main clock signal and outputting a first clock generation control signal and a second clock generation control signal, a duty ratio of which varies based on a frequency of the main clock signal;

receiving the first clock generation control signal and the second clock generation control signal and outputting a first clock signal and a second clock signal which have variable duty ratios and different phases;

receiving the first clock signal and the second clock signal and outputting gate signals which have variable duty ratios; and turning on pixels according to the gate signals to display an image, wherein the duty ratio is duration of time for which a signal is maintained at a high level in one period of the signal.

16. The method of claim 15, wherein the duty ratio of the second clock generation control signal decreases when the frequency of the main clock signal is less than a reference frequency and increases when the frequency of the main clock signal is greater than the reference frequency.

17. The method of claim 16, wherein the outputting of the second clock generation control signal comprises:

comparing the frequency of the main clock signal with the reference frequency;

supplying a counting control signal which controls a counting number according to a result of the comparison; and outputting the second clock generation control signal which is at a high level while counting rising edges or falling edges of the main clock signal on the basis of the counting number which corresponds to the counting control signal.

18. The method of claim 15, wherein the duty ratio of the second clock generation control signal decreases when a frequency of the second clock generation control signal is less than a reference frequency and increases when the frequency of the second clock generation control signal is greater than the reference frequency.

19. The method of claim 18, wherein the outputting the second clock generation control signal comprises:

comparing the frequency of the second clock generation control signal with the reference frequency;

supplying a counting control signal which controls a counting number according to a result of the comparison; and outputting the second clock generation control signal which is at the high level while counting rising edges or falling edges of the main clock signal on the basis of the counting number which corresponds to the counting control signal.

20. The method of claim 15, wherein the time when the second clock generation control signal is at the high level during one period is constant regardless of a frame frequency of the liquid crystal display.

21. The liquid crystal display of claim 1, wherein the first clock signal and the second clock signal have opposite phases.

22. The method of claim 15, wherein the first clock signal and the second clock signal have opposite phases.

23. The liquid crystal display of claim 1, wherein the first clock signal and the second clock signal have different phases.

24. The method of claim 15, wherein the first clock signal and the second clock signal have different phases.

* * * * *